United States Patent
Tan et al.

(10) Patent No.: US 8,413,083 B2
(45) Date of Patent: Apr. 2, 2013

(54) MASK SYSTEM EMPLOYING SUBSTANTIALLY CIRCULAR OPTICAL PROXIMITY CORRECTION TARGET AND METHOD OF MANUFACTURE THEREOF

(75) Inventors: Sia Kim Tan, Singapore (SG); Gek Soon Chua, Singapore (SG); Kwee Liang Martin Yeo, Singapore (SG); Ryan Khoon Khye Chong, Singapore (SG); Moh Lung Ling, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 303 days.

(21) Appl. No.: 12/465,431

(22) Filed: May 13, 2009

(65) Prior Publication Data

US 2010/0293516 A1   Nov. 18, 2010

(51) Int. Cl.
*G06F 17/50* (2006.01)
(52) U.S. Cl. .............. 716/53; 716/51; 716/55
(58) Field of Classification Search ............ 716/53
See application file for complete search history.

(56) References Cited

U.S. PATENT DOCUMENTS

| | | | |
|---|---|---|---|
| 7,355,681 B2 | 4/2008 | Laidig et al. | |
| 2002/0177078 A1* | 11/2002 | Blatchford et al. | 430/313 |
| 2004/0170905 A1* | 9/2004 | Liebmann et al. | 430/5 |
| 2005/0106882 A1* | 5/2005 | Chao et al. | 438/700 |
| 2005/0198598 A1* | 9/2005 | Adam | 716/4 |
| 2007/0047798 A1 | 3/2007 | Isomura | |
| 2008/0226996 A1* | 9/2008 | Chen et al. | 430/48 |

OTHER PUBLICATIONS

Li et al., Model based optical proximity correction runtime saving with multisegment solver, Nov. 2009, Journal of Vacuum Science & Technology B: Microelectronics and Nanometer Structures, vol. 27, Issue 6, pp. 2972-2978.*

* cited by examiner

*Primary Examiner* — Paul Dinh
*Assistant Examiner* — Bryce Aisaka
(74) *Attorney, Agent, or Firm* — Ishimaru & Associates LLP

(57) ABSTRACT

A method of manufacture of a mask system includes: providing design data; generating a substantially circular optical proximity correction target from the design data; biasing a segment of the substantially circular optical proximity correction target; and generating mask data based on the shape produced by biasing the segment of the substantially circular optical proximity correction target.

20 Claims, 8 Drawing Sheets

MASK SYSTEM EMPLOYING SUBSTANTIALLY CIRCULAR OPTICAL PROXIMITY CORRECTION TARGET AND METHOD OF MANUFACTURE THEREOF

TECHNICAL FIELD

The present invention relates generally to an integrated circuit system, and more particularly to an integrated circuit system formed from a mask system employing a substantially circular optical proximity correction target.

BACKGROUND ART

Integrated circuits can be found in many of today's consumer electronics, such as cell phones, video cameras, portable music players, printers, computers, etc. Integrated circuits may include a combination of active devices, passive devices and their interconnections.

Photolithography is one of the principle processes in the manufacture of integrated circuits, and consists of patterning the surface of a semiconductor wafer in accordance with the design and layout of the integrated circuits to be formed. One of the major features formed by photolithography within an integrated circuit is the contact hole structure.

Uniformity of these contact hole structures becomes increasingly critical as the technology node continues to decrease for high-performance integrated circuits. Unfortunately, optical proximity effects, such as light diffraction and interference, can greatly impact the uniformity of these contact hole structures as the technology node continues to decrease. Thus, optical proximity correction (OPC) was developed by the semiconductor industry to offset optical proximity effects.

For contact hole structures, OPC technology is typically performed on square polygons despite the fact that the intended feature of a contact hole structure is generally circular at the design and wafer level. As such, prior methodologies employ a square OPC target that utilizes the frequency filtering effects of a projection optics system to induce corner rounding at the printed feature, which then results in printing of a circular hole. Conventional OPC techniques applied to square OPC targets include the addition of serifs at edges and dimensional biasing to ensure the printed feature is within a tolerable dimension.

Unfortunately, as the semiconductor industry moves towards smaller dimensions, the process window gain from conventional OPC methods for contact holes has become limited. Additionally, other issues encountered for contact holes, such as side lobe printing, missing contact holes, and pattern fidelity, further impact the process window for contact hole patterning. Furthermore, as integrated circuit dimensions become smaller, the loss in image fidelity due to the low pass filter effect of the projection optics system will become even more pronounced.

Thus, a need still remains for a reliable mask system and method of fabrication, as well as a reliable integrated circuit system and method of fabrication, wherein the mask system and the integrated circuit system produce an enhanced image fidelity and process window for contact hole patterning. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of a mask system including: providing design data; generating a substantially circular optical proximity correction target from the design data; biasing a segment of the substantially circular optical proximity correction target; and generating mask data based on the shape produced by biasing the segment of the substantially circular optical proximity correction target.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
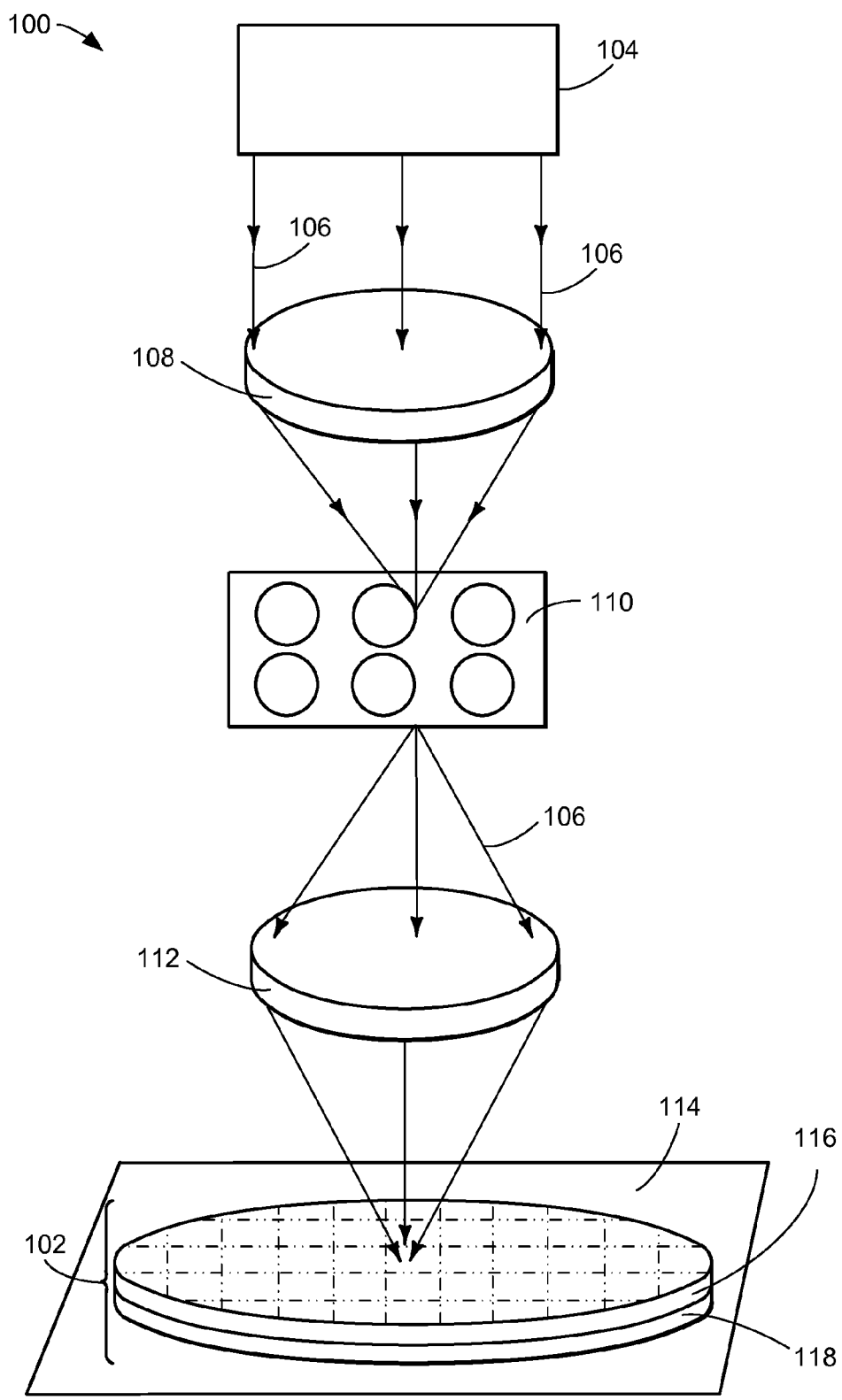
FIG. 1 is an isometric view of the basic elements of a photolithography system employing a mask system to pattern an integrated circuit system in accordance with an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals.

For expository purposes, the term "horizontal" as used herein is defined as a plane parallel to the conventional plane or surface of a substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "processing" as used herein includes deposition of material or photoresist, patterning, exposure, development, etching, cleaning, and/or removal of the material or photoresist as required in forming a described structure.

The term "on" is used herein to mean there is direct contact among elements.

The terms "example" or "exemplary" are used herein to mean serving as an instance or illustration. Any aspect or embodiment described herein as an "example" or as "exemplary" is not necessarily to be construed as preferred or advantageous over other aspects or designs.

The term "layer" encompasses both the singular and the plural unless otherwise indicated.

The terms "mask" and "reticle" as used herein are to be used interchangeably as the present embodiments are equally applicable to either system or method (e.g., mask or reticle) of forming a pattern by photolithography.

FIGS. 1-10, which follow, depict by way of example and not by limitation, one or more exemplary systems or methods used to fabricate a mask system and/or an integrated circuit system and they are not to be construed as limiting. It is to be understood that a plurality of conventional processes that are well known within the art and not repeated herein, may precede or follow FIGS. 2 and 3. Moreover, it is to be understood that many modifications, additions, and/or omissions may be made to the below described process without departing from the scope of the claimed subject matter. For example, the below described process may include more, fewer, or other steps. Additionally, steps may be performed in any suitable order without departing from the scope of the present invention.

Moreover, it is to be appreciated that the integrated circuit system of the present disclosure may include any number of active devices (e.g., a multi-electrode device in which the current flowing between two specified electrodes is controlled or modulated by the voltage applied at a control electrode) and/or passive devices and their interconnections. Exemplary illustrations of the one or more active devices may include, without limitation, an n-channel field effect transistor (NFET), a p-channel field effect transistor (PFET), a complementary metal-oxide-silicon (CMOS) configuration, a single-gate transistor, a multi-gate transistor, a fin-FET, or an annular gate transistor. Exemplary illustrations of the one or more passive devices may include, without limitation, resistance devices with varying resistance values formed by strategically altering the process techniques. Exemplary illustrations of the interconnection(s) may include, without limitation, one or more contact hole structures. Furthermore, it is to be understood that one or more of the integrated circuit system could be prepared at one time on a medium, which could be separated into individual or multiple integrated circuit assemblies at a later stage of fabrication.

Furthermore, it is to be understood that the integrated circuit system manufactured by the embodiments described herein can be used within a multitude of electronic systems, such as processor components, memory components, logic components, digital components, analog components, mixed-signal components, power components, radio-frequency (RF) components (e.g., RF CMOS circuits), digital signal processor components, micro-electromechanical components, optical sensor components, and so forth, in numerous configurations and arrangements as may be needed.

It should be understood that the definitions and nomenclature used herein are given by way of example only and that one skilled in the art would readily understand that other definitions and nomenclature may be used to illustrate the techniques, systems, devices, and methods described herein.

Generally, the following embodiments relate to a mask system including a feature formed utilizing a circular OPC target. In at least one embodiment, the OPC target can be subject to radial segmentation with certain segments of the OPC target biased The mask systems referred to herein may include geometric and/or polygonal shaped patterns corresponding to the circuit components to be integrated onto a wafer or substrate. The patterns used to create such masks can be generated utilizing CAD (computer-aided design) programs, such as an EDA (electronic design automation) software program. Most CAD programs follow a set of predetermined design rules that enable the designer to create functional masks. Generally, these rules are set by processing and design limitations. For example, design rules can define the space tolerance between circuit devices (such as gates, capacitors, etc.) or contact holes, so as to ensure that the circuit devices or contact holes do not interact with one another in an undesirable way. The design rule limitations are typically referred to as "critical dimensions" (CD). By way of example, a critical dimension of a circuit can be defined as the smallest width of a contact hole and/or the smallest space permitted between two contact holes.

Referring now to FIG. 1, therein is shown an isometric view of the basic elements of a photolithography system 100 used to pattern an integrated circuit system 102 in accordance with an embodiment of the present invention.

The photolithography system 100 includes a radiation source 104, a radiation beam 106, a condenser 108, a mask system 110, a projection optics 112, and a stepper 114. Generally, the mask system 110 is illuminated by the radiation beam 106 emitted from the radiation source 104 and a pattern of the mask system 110 is projected onto a photoresist material 116, which coats a substrate 118. By way of example, the radiation source 104 may include any form of on-axis or off-axis energy that can be propagated as waves or streams of charged particles.

As is evident from the illustration, the radiation beam 106 emitted by the radiation source 104 passes through the condenser 108, and is projected onto the mask system 110. In some embodiments, the condenser 108 may include optical lenses, mirrors, and apertures, such as slits, for the purpose of controlling and directing the radiation beam 106 onto a precisely defined area of the mask system 110.

After passing through the mask system 110, the radiation beam 106 carries information as to patterns formed on the mask system 110. The resulting patterns are imaged onto the photoresist material 116 formed over the substrate 118 by the projection optics 112. The projection optics 112 may include mirrors, lenses, filters, apertures, and other optical devices for directing the radiation beam 106 onto the integrated circuit system 102.

It is to be understood that the photoresist material 116 may include any type of an energy sensitive film such as a negative tone resist, a positive tone resist, or a chemically amplified resist that is deposited by techniques well known in the art and not repeated herein. Additionally, it is to be understood that the photoresist material 116 may include one or more layers patterned one or more times with measured CD widths below about 45 nanometers. Moreover, it will be appreciated by those skilled in the art that additional layers, such as a primer, a top anti-reflective coating and/or a bottom anti-reflective coating may be employed to enhance the development of the photoresist material 116.

After exposing the photoresist material 116, the substrate 118 can be baked and developed, leaving regions covered by the photoresist material 116 and complementary regions that are not covered. The pattern produced by the mask system 110 may be used to manufacture integrated circuit components within the integrated circuit system 102. After several more semiconductor processing steps, including multiple additional patterning operations, the substrate 118 can be separated (e.g., diced) into individual or multiple semiconductor assemblies.

Each of the integrated circuit system 102 formed on the substrate 118 may include many different layers. These different layers may include metallization layers, semiconducting layers, dielectric layers, barrier layers, etc. The different layers may have different patterns, which may define circuit components, such as active devices, passive devices, and their interconnections. The different patterns and/or layers may be imaged by a single multi-layer reticle or multiple multi-layer reticles in a series of imaging operations.

It is to be understood that the photolithography system 100 presented above merely represents one example or illustration of such a system and there is no intention to limit any embodiment to this configuration, the illustrated parts, or the arrangement of parts.

Figure 2:
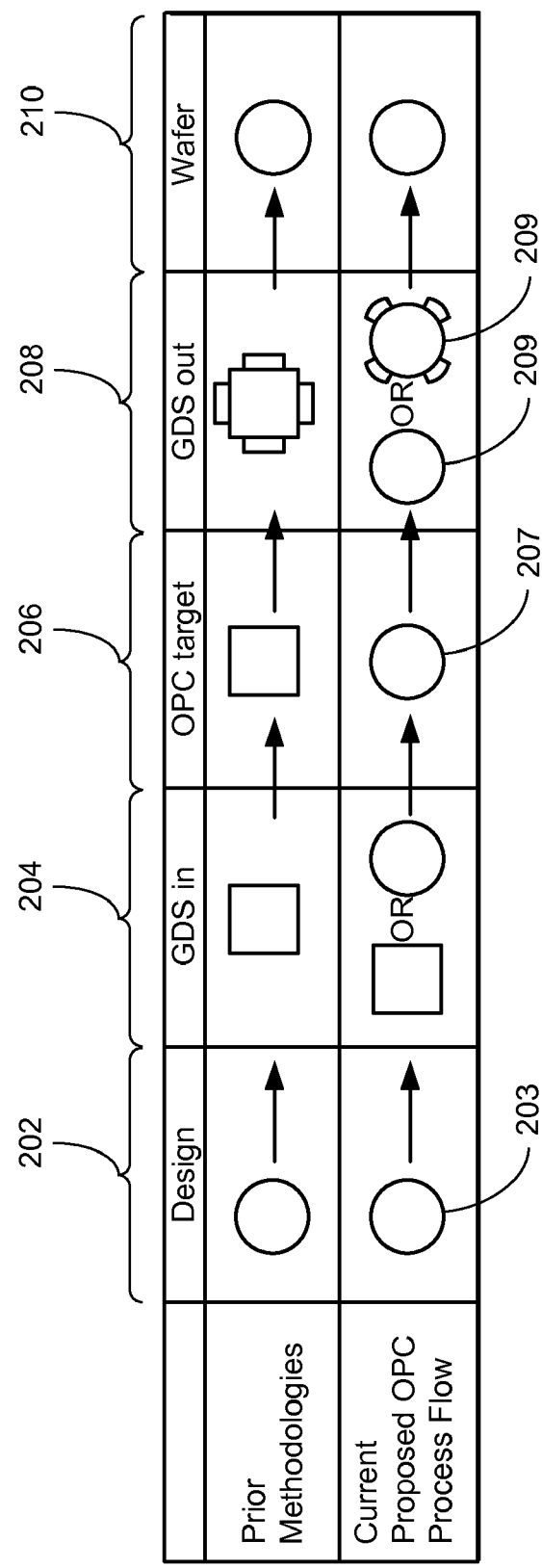
FIG. 2 is an exemplary depiction of a flow diagram for an OPC process.

Referring now to FIG. 2, therein is shown an exemplary depiction of a flow diagram 200 of an OPC process. Generally, the flow diagram 200 depicts an OPC process flow for targeting a substantially circular pattern on the mask system 110 and the substrate 118, both of FIG. 1. For purposes of illustration, the flow diagram 200 compares and contrasts the prior methodologies for targeting a circular pattern against the current proposed OPC process flow of the present embodiments. It will be appreciated by those of ordinary skill in the art that the flow diagram 200 represents a generalized schematic illustration and that other steps may be added or existing steps may be removed or modified.

From viewing the flow diagram 200 it is to be understood that prior OPC process flow methodologies print a circular pattern on the wafer despite targeting a square pattern in the OPC portion of the process. However, it will be appreciated by those of ordinary skill in the art that at small feature sizes, the sharp edges of the square pattern of prior methodologies at the mask affect the image fidelity and result in smaller process windows for the process. The present inventors have discovered that by targeting a substantially circular optical proximity correction (OPC) target, as opposed to a square OPC target that image fidelity and process window parameters can be improved.

Generally, the flow diagram 200 begins with generating a design data 203 describing an integrated circuit layout pattern in a step 202. Typically, the integrated circuit layout pattern can model the design of the active devices, passive devices, and/or their interconnections within the integrated circuit system. In at least one embodiment, the integrated circuit layout pattern can model the design of one or more contact holes formed in isolated, semi-dense or dense arrays. In such case, the contact hole design may include a polygon shaped feature and/or a substantially circular shaped polygon feature. Both the prior methodologies and the current proposed OPC process flow may include a circular design at the step 202.

The design data of the step 202 can be converted to a database file format, e.g., graphic data system II (GDSII), in a step 204. It is to be understood that the database file format can be used to represent the planar geometric and/or polygonal shapes and other information about the integrated circuit layout pattern in hierarchical form that can be used to create the mask system 110, of FIG. 1. Generally, the step 204 can be referred to as the "GDS in" portion of the mask data preparation. It will be appreciated by those skilled in the art that prior methodologies typically convert the circular design pattern of the step 202 to a square feature at the "GDS in" stage.

Unlike prior methodologies, in at least one embodiment, the current proposed OPC process flow can retain the circular design pattern generated at the step 202 by forming a substantially circular feature at the "GDS in" stage. In other embodiments, the current proposed OPC process flow can convert the circular design pattern generated at the step 202 to a square feature at the "GDS in" stage. It will be appreciated by those skilled in the art that the shape or configuration chosen at the step 204 may depend upon the optimization of the particular process.

The data created in the step 204 can then be subject to an OPC process in a step 206. Per the flow diagram 200 it can be seen that prior methodologies form the OPC target at the step 206 as a square feature. Unlike prior methodologies, the current proposed OPC process flow at the step 206 generates a substantially circular OPC target 207 from the design data 203 and/or the contact hole design. In at least one embodiment, the substantially circular OPC target 207 generated at the step 206 may include a polygon shaped feature and/or a substantially circular shaped polygon feature.

The data for the substantially circular OPC target 207 created in the step 206 can be transferred to a "GDS out" (e.g., GDSII file format) portion of the mask data preparation at a step 208. The step 208 can also be referred to as the "tape-out" data or mask data 209 for production of the mask system 110 to produce finished integrated circuits.

In at least one embodiment, the "GDS out" pattern generated on the mask system 110 by targeting a substantially circular OPC pattern can be a substantially circular aperture. In other embodiments, the "GDS out" pattern generated on the mask system 110 by targeting a substantially circular OPC pattern can be a substantially circular aperture with certain segments of the OPC target and/or the "GDS out" pattern biased by extending the arc of the substantially circular pattern in a radial direction.

It will be appreciated by those skilled in the art that in order to improve the manufacturability of the OPC target produced in the step 206 that the "GDS out" pattern designs of the step 208 may employ OPC techniques that alter a mask layout pattern in order to correctly create the desired pattern of objects on a wafer. By way of example, the step 208 may involve geometric and/or polygonal manipulations of the layout to improve manufacturability of the design. It is to be understood that the OPC techniques applied at the step 208 can help to improve the image fidelity and process window of the substantially circular OPC target 207.

A step 210 represents the image produced on the wafer or the substrate 118, of FIG. 1, by the "GDS out" data pattern formed on the mask system 110.

It will be appreciated by those skilled in the art that during the mask writing process a substantially circular mask pattern produced by the steps 202-208 will be polygonal in shape and will not be perfectly circular. However, it is to be understood that the polygonal shape formed by the current proposed OPC process flow will posses a configuration with a more gradual transition at the edges compared to the square configurations of the prior methodologies, thereby improving image fidelity. As such, any substantially circular mask pattern produced by the steps 202-208 that is described as polygonal in shape will not be perfectly polygonal because of the gradual transition at the edges forming a non-regular polygonal shape. In other embodiments, the mask writing process can also include a substantially circular mask pattern produced by the steps 202-208 with arc portions or segments formed along and defining the perimeter of the substantially circular mask pattern.

Moreover, it will be appreciated by those skilled in the art that the process flow depicted by the flow diagram 200 can be adjusted and repeated iteratively until the image produced on the wafer falls within an acceptable tolerance value.

Figure 3:
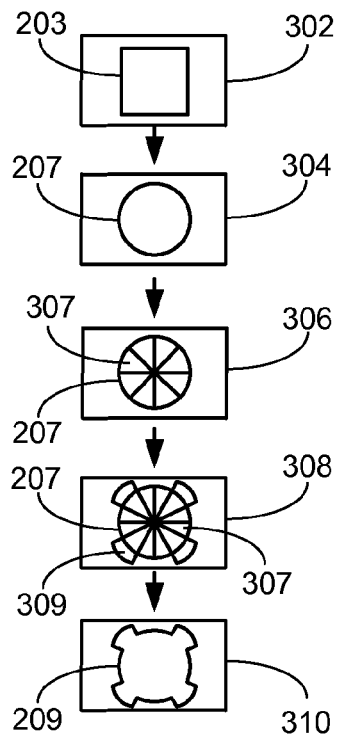
FIG. 3 is an exemplary process flow to generate a substantially circular mask aperture in accordance with an embodiment of the present invention.

Referring now to FIG. 3, therein is shown an exemplary process flow to generate a substantially circular mask aperture in accordance with an embodiment of the present invention. Although the current illustration is exemplified by a single feature (e.g., a contact hole design), it is to be understood that the process flow may apply to isolated, semi-dense, and/or dense configurations of the feature. It will be appreciated by those of ordinary skill in the art that the exemplary process flow represents a generalized schematic illustration and that other steps may be added or existing steps may be removed or modified.

Generally, in a step 302, the design data 203 can be generated describing an integrated circuit layout pattern. In at least one embodiment, the design data 203 may model and/or represent a contact hole design and/or pattern. In such cases, the contact hole design and/or pattern may include polygon shaped squares, rectangles and/or circular designs.

In a step 304, the substantially circular OPC target 207 can be generated based on the design and/or pattern information provided from the step 302. In at least one embodiment, the substantially circular OPC target 207 generated at the step 304 may include a polygon shaped feature and/or a substantially circular shaped polygon feature. It is to be understood that planar geometric and/or polygonal shapes categorized in hierarchical form can be used to create the substantially circular OPC target 207.

In a step 306, the substantially circular OPC target 207 generated in the step 304 can be partitioned by a radial segmentation method to form two or more equal or unequal partitions, such as a segment 307, within the substantially circular OPC target 207. In at least one embodiment, the substantially circular OPC target 207 generated in the step 304 can be segmented into substantially equal portions of the segment 307 that can be schematically represented as triangular shaped wedges emanating from the center of the substantially circular OPC target 207 and terminating with the perimeter of the substantially circular OPC target 207.

In a step 308, selective biasing of one or more of the segment 307 of the partitioned form of the substantially circular OPC target 207 can be performed to form a biased segment 309. Generally, one or more of the segment 307 can be biased by extending the arc of the segment 307 located along the perimeter of the circular OPC target in the radial direction. Stated another way, the segment 307 can be biased by extending the perimeter of the segment 307 outward from the center point of the substantially circular OPC target 207 while maintaining the dimensions of the segment 307 within the substantially circular OPC target 207. As such, in some embodiments, since only the perimeter of the circular OPC target and the associated sides of a biased one of the segment 307 are extended radially, the dimensions of each of the segment 307 within the substantially circular OPC target 207 can be maintained. In at least one embodiment, biased forms of the segment 307 can be located substantially equidistant from the other biased forms of the segment 307, although it is understood that other configurations are possible. It is to be understood that the selective biasing of the segment 307 can be implemented with reference to nearby feature distribution.

In a step 310, "GDS out" data can be generated for the mask system 110, of FIG. 1, based on the shape produced in the step 308. It will be appreciated by those skilled in the art that the image produced on the mask system 110 may include an aperture whose outline substantially mirrors the perimeter of the shape produced in the step 308. Generally, the "GDS out" data can be referred to as the mask data 209.

Figure 4:
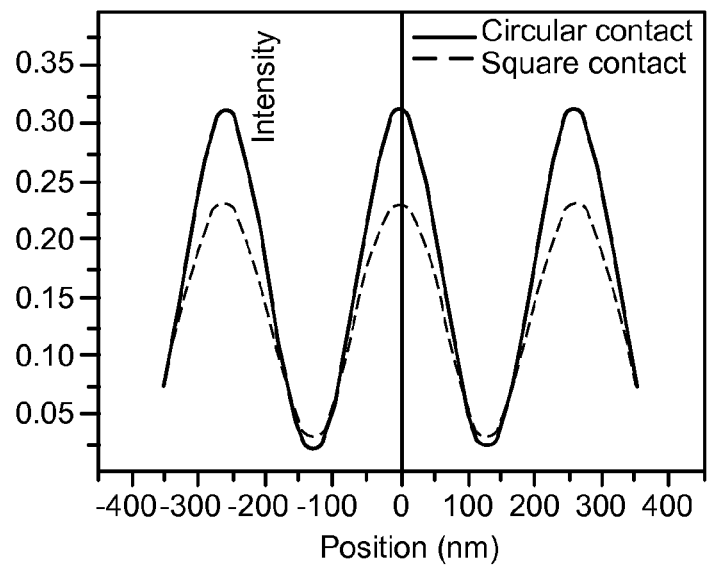
FIG. 4 is an exemplary graphical representation of an aerial image intensity produced by a square pattern versus a substantially circular pattern.

Referring now to FIG. 4, therein is shown an exemplary graphical representation of an aerial image intensity produced by a square pattern versus a substantially circular pattern. The exemplary graphical representation plots the intensity along the "Y" axis and the position in nanometers along the "X" axis. Generally, the exemplary graphical representation depicts how the aerial image intensity produced by the circular pattern of the present embodiments is higher than that of a square one produced by prior methodologies. In some instances, the aerial image intensity produced by the circular pattern shows an average of 30% improvement over that of a square one.

Figure 5:
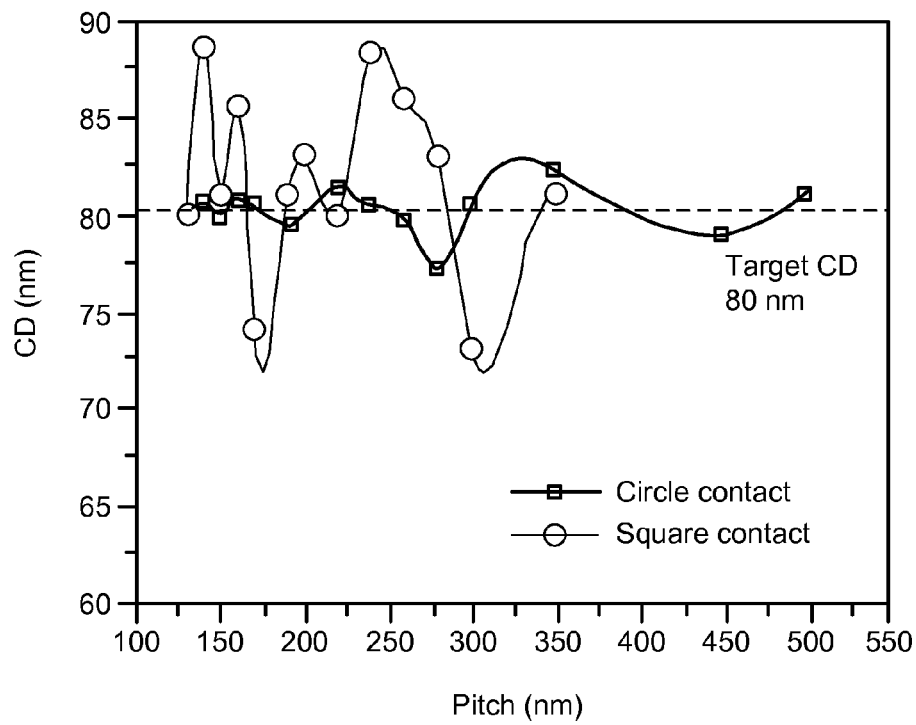
FIG. 5 is a simulated critical dimension through pitch (aerial image) for a substantially circular pattern versus a square pattern.

Referring now to FIG. 5, therein is shown a simulated critical dimension through pitch (aerial image) for a substantially circular pattern versus a square pattern. The exemplary graphical representation plots the critical dimension (CD) in nanometers along the "Y" axis and the pitch in nanometers along the "X" axis. Per this simulation, dimensional biasing was applied for both square and circular patterns, with a target critical dimension (CD) of 80 nm. The optimized illumination condition for both square and circular contact arrays of 130 nm was used and it is the same for both shapes. Per the results, it can be seen that the circular pattern of the present embodiments shows less fluctuation in CD and has better CD control through pitch. Accordingly, it has been shown that a substantially circular pattern produced at the "GDS in", OPC, "GDS out", and/or mask level can improve the imaging performance for a contact array pattern as compared to a square target pattern of prior methodologies.

It will be appreciated by those skilled in the art that beyond a 350 nm pitch, the square contact array did not show sufficient image contrast and CD was undefined.

Figure 6:
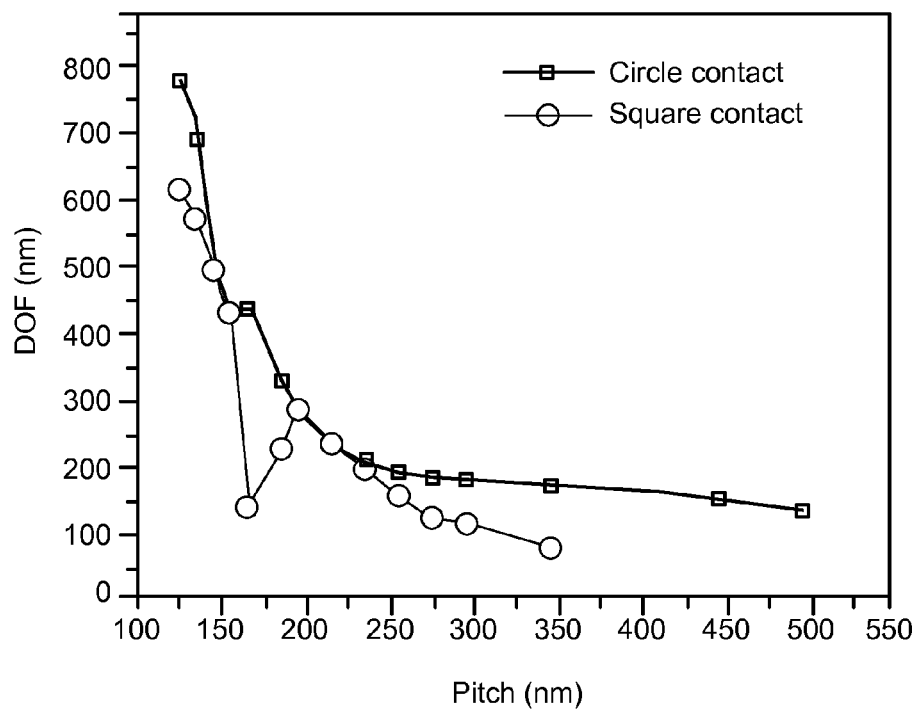
FIG. 6 is a simulated depth of focus through pitch (aerial image) for a substantially circular pattern versus a square pattern.

Referring now to FIG. 6, therein is shown a simulated depth of focus through pitch (aerial image) for a substantially circular pattern versus a square pattern. The exemplary graphical representation plots the depth of focus (DOF) in nanometers along the "Y" axis and the pitch in nanometers along the "X" axis. Per this simulation, the DOF degrades as pitch increases for both circular and square contact arrays. Although, the circular pattern of the present embodiments exhibits an average of 20% improvement in DOF as compared to the square pattern of prior methodologies. Accordingly, it has been shown that a substantially circular pattern produced at the "GDS in", OPC, "GDS out", and/or mask level can improve the imaging performance for a contact array pattern as compared to a square pattern.

Figure 7:
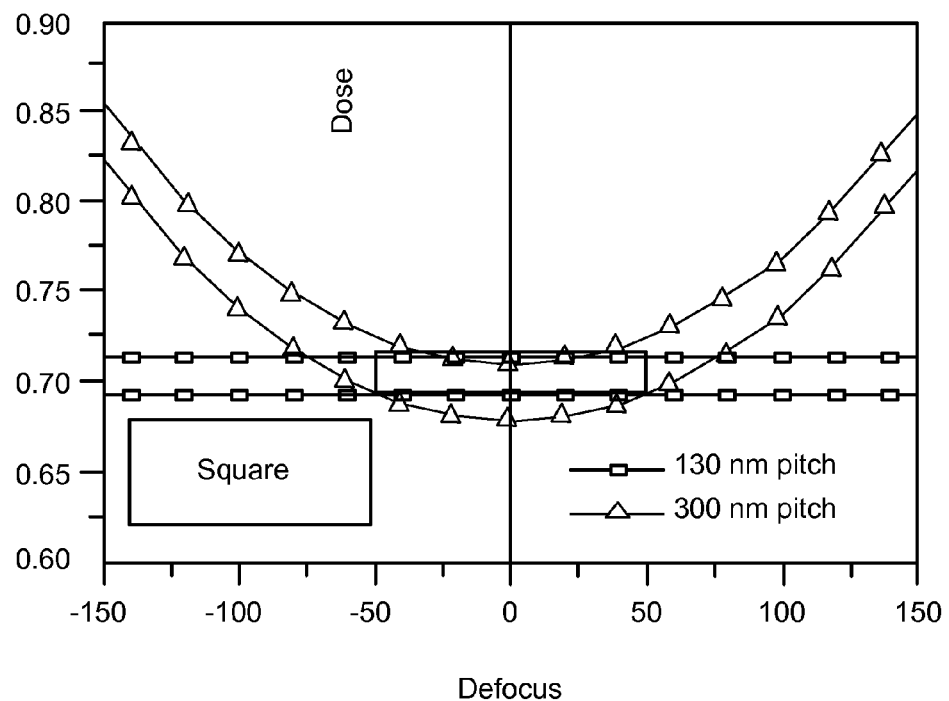
FIG. 7 is an exemplary graph illustrating a simulated process window for dense and wide pitch square features formed by prior methodologies.

Referring now to FIG. 7, therein is shown an exemplary graph illustrating a simulated process window for dense (130 nm) and wide (300 nm) pitch square features formed by prior methodologies.

Figure 8:
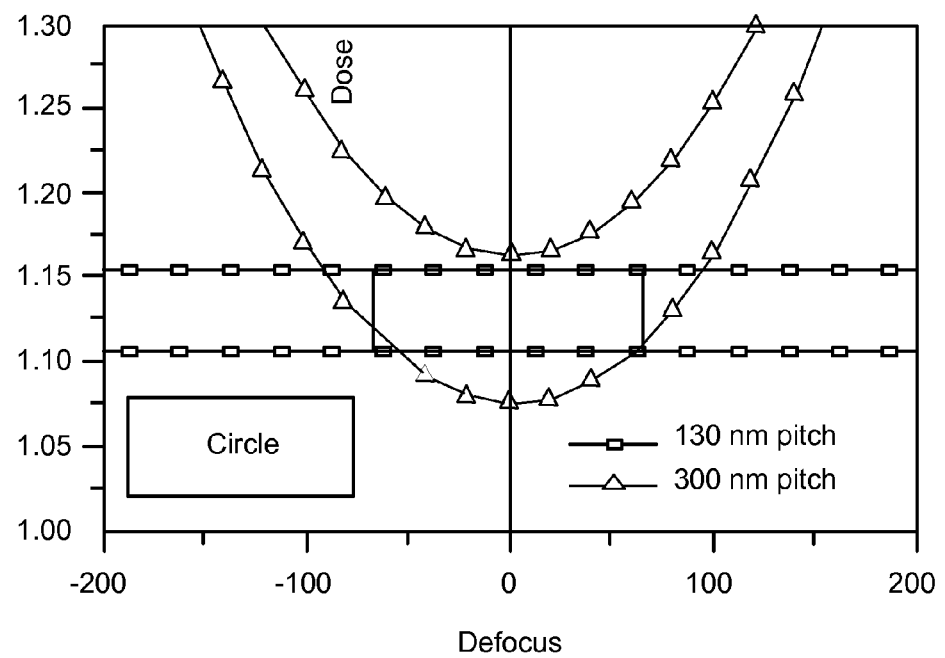
FIG. 8 is an exemplary graph illustrating a simulated process window for dense and wide pitch substantially circular features formed by the current proposed OPC process flow of the present embodiments.

Referring now to FIG. 8, therein is shown an exemplary graph illustrating a simulated process window for dense (130 nm) and wide (300 nm) pitch substantially circular features formed by the current proposed OPC process flow of the present embodiments. Notably, the common process window has improved by about 28% for a circular pattern produced by the present embodiments as compared to the square pattern of FIG. 6 produced by prior methodologies.

Figure 9:
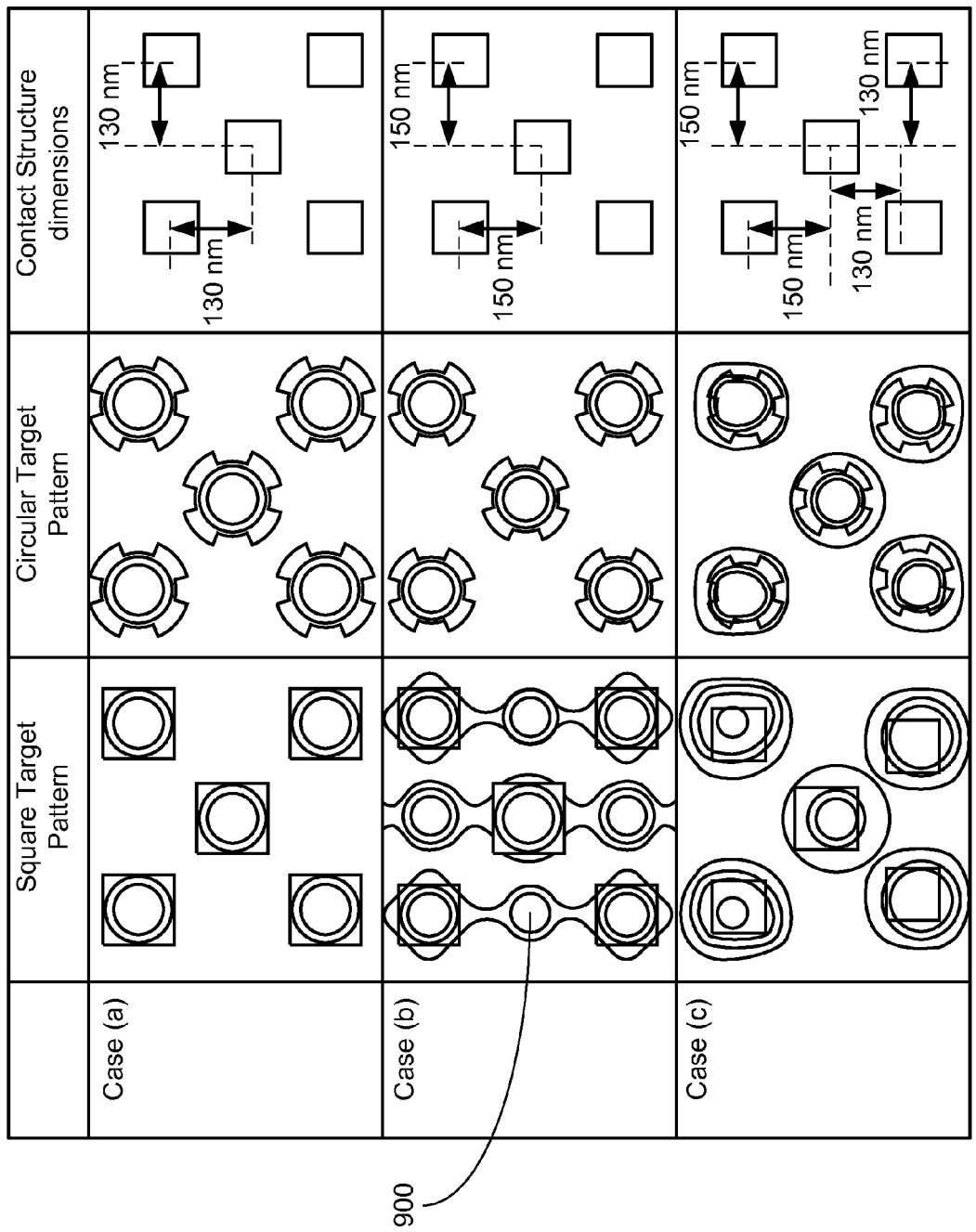
FIG. 9 is a simulated aerial image contour plot for different staggered structures for both square and substantially circular patterns.

Referring now to FIG. 9, therein is shown a simulated aerial image contour plot for different staggered structures for both square and substantially circular patterns. It is to be understood that the square target pattern refers to prior methodologies and that the circular target patter refers to the current proposed OPC process flow of the present embodiments. It will be appreciated by those skilled in the art that the concept of a circular target pattern can be extended to periodic and non-periodic structures, which are often encountered in design.

The aerial image contour plot depicts staggered contact structures with 130 nm X and Y separation dimensions in case (a), staggered contact structures with 150 nm X and Y separation dimensions in case (b), and staggered contact structures with 130 nm and 150 nm X and Y separation dimensions in case (c). It is to be understood that optimized illumination conditions for both square and circular contacts array of 130 nm is simulated and it is the same for both shapes.

The illustration depicts an improved image contrast produced by the circular target pattern of the current proposed OPC process flow as compared to that of the square target pattern produced by prior methodologies. For example, in case (b), a side lobe 900 is printed for the square target pattern, but it is not observed for the circular target pattern produced by the present embodiments. Not wishing to be limited to any particular theory, the present inventors believe that the square edges of the square target pattern tend to diffract more light away from the main feature, thereby causing the side lobe 900 formations around the main feature. The present inventors have discovered that by employing the circular target pattern of the present embodiments that the circular targets possess a more gradual transition at the edges and this reduces the amount of light diffracted away from the main feature, thereby improving the image fidelity.

Furthermore, in case (c), a better CD control for all of the contact holes surrounding the center/main hole or feature can be achieved for the circular target pattern produced by the current embodiments. It will be appreciated by those skilled in the art that the CD error for the square target pattern is much larger than that of the circular target pattern.

Figure 10:
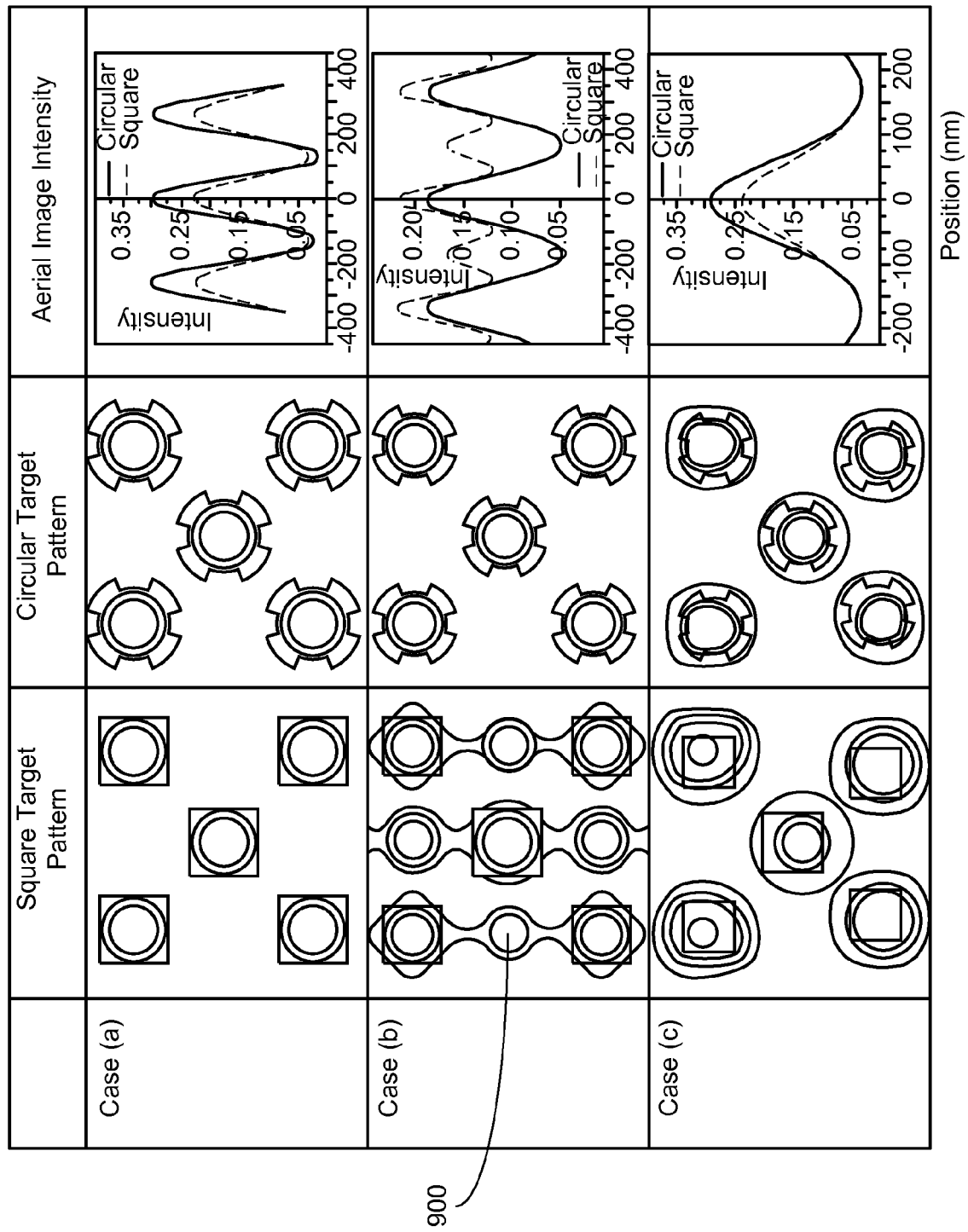
FIG. 10 is a simulated aerial image contour plot along with a simulated aerial image intensity plot for different staggered structures for both square and substantially circular patterns.

Referring now to FIG. 10, therein is shown a simulated aerial image contour plot along with a simulated aerial image intensity plot for different staggered structures for both square and substantially circular patterns. Staggered contact structures with 130 nm X and Y separation dimensions are shown in case (a), staggered contact structures with 150 nm X and Y separation dimensions are shown in case (b), and staggered contact structures with 130 nm and 150 nm X and Y separation dimensions are shown in case (c).

The illustration depicts an improved image contrast produced by the circular target pattern of the current proposed OPC process flow as compared to that of the square target pattern produced by prior methodologies. In particular, case (a) shows that the aerial image intensity for the circular target pattern produced by the current embodiments can be higher than that of a square target pattern. In some instances, the aerial image intensity produced by the circular target pattern shows an average of 30% improvement over that of a square target pattern.

Furthermore, in case (b), the aerial image intensity for the square target pattern depicts the side lobe 900 exhibiting an aerial image intensity maxima at around plus or minus 150 nm. The corresponding simulation plot of the circular target pattern exhibits an aerial image intensity plot of less than a third of the value exhibited by the square target pattern at around plus or minus 150 nm. Accordingly, the incidence of the side lobe 900 formation can be greatly reduced by employing the circular target pattern of the present embodiments. Additionally, in case (c), the aerial image intensity produced by the circular target pattern shows an average of 25% improvement over that of a square target pattern.

Generally, FIGS. 9 and 10 depict that the image contrast produced by a substantially circular target OPC pattern can be improved significantly compared to that of a square target pattern. Furthermore, FIGS. 8 and 9 depict that the aerial image result from a substantially circular optical proximity correction target pattern exhibited improved image contrast compared to that of a square target pattern, thus, giving the circular target pattern image better process window and CD control.

Figure 11:
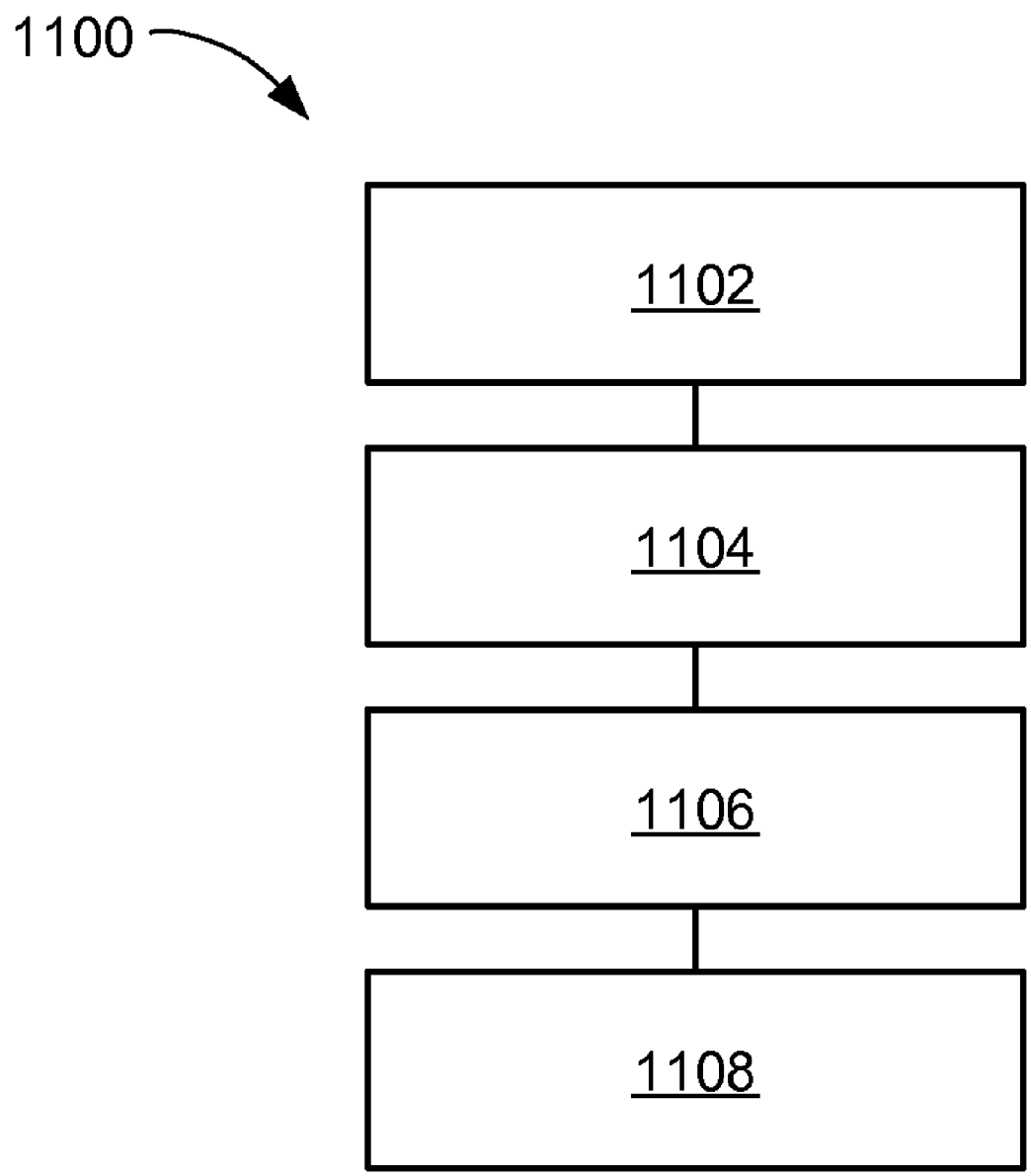
FIG. 11 is a flow chart of a method of manufacture of a mask system in an embodiment of the present invention.

Referring now to FIG. 11, therein is shown a flow chart of a method 1100 of manufacture of the mask system 110, of FIG. 1, in an embodiment of the present invention. The method 1100 includes: providing design data in a block 1102; generating a substantially circular optical proximity correction target from the design data in a block 1104; biasing a segment of the substantially circular optical proximity correction target in a block 1106; and generating mask data based on the shape produced by biasing the segment of the substantially circular optical proximity correction target in a block 1108.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

It has been discovered that the present invention thus has numerous aspects. One such aspect is that a substantially circular OPC target provides an improved process window and CD control for patterning a contact hole design.

It has been discovered that the present invention helps improve the process window and CD control for patterning a contact hole design by biasing selected segments of a substantially circular OPC target.

It has been discovered that the present invention helps improve the aerial image intensity of a contact hole design by forming the OPC target as a substantially circular feature, as opposed to a square feature.

It has been discovered that the present invention helps CD through pitch of a contact hole design by forming the OPC target as a substantially circular feature, as opposed to a square feature.

It has been discovered that the present invention helps improve the depth of focus through pitch of a contact hole design by forming the OPC target as a substantially circular feature, as opposed to a square feature.

It has been discovered that the present invention helps to prevent the formation of side lobes by forming the OPC target as a substantially circular feature, as opposed to a square feature.

Yet another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit device comprising:
   providing design data;
   generating a substantially circular optical proximity correction target from the design data;
   biasing a segment of the substantially circular optical proximity correction target by extending an arc of the substantially circular optical proximity correction target, while maintaining a dimension of a different segment within the substantially circular optical proximity correction target;
   generating mask data, based on the shape produced by biasing the segment of the substantially circular optical proximity correction target, by using a computer aided design system; and
   making a mask from the mask data.

2. The method as claimed in claim 1 wherein:
   providing the design data includes providing a polygon shaped feature.

3. The method as claimed in claim 1 wherein:
   generating the substantially circular optical proximity correction target includes generating a substantially circular shape.

4. The method as claimed in claim 1 wherein:
   biasing the segment of the substantially circular optical proximity correction target includes biased forms of the segment located substantially equidistant from the other biased forms of the segment.

5. The method as claimed in claim 1 wherein:
   generating the mask data includes generating a graphic data system out pattern for the mask.

6. A method of manufacture of an integrated circuit device comprising:
   providing a contact hole design;
   generating a substantially circular optical proximity correction target of the contact hole design;
   segmenting the substantially circular optical proximity correction target;
   biasing a segment of the substantially circular optical proximity correction target by extending an arc of the substantially circular optical proximity correction target, while maintaining a dimension of a different segment within the substantially circular optical proximity correction target;
   generating mask data, based on the shape produced by biasing the segment of the substantially circular optical proximity correction target, by using a computer aided design system; and
   making a mask from the mask data.

7. The method as claimed in claim 6 wherein:
   providing the contact hole design includes providing a circular shaped feature.

8. The method as claimed in claim 6 wherein:
   segmenting the substantially circular optical proximity correction target includes segmenting the substantially circular optical proximity correction target into substantially equal partitions.

9. The method as claimed in claim 6 wherein:
   biasing a segment of the substantially circular optical proximity correction target includes biasing more than one of the segment.

10. The method as claimed in claim 6 wherein:
    generating the mask data based on the shape produced by biasing the segment of the substantially circular optical proximity correction target helps to prevent formation of a side lobe.

11. A method of manufacture of an integrated circuit device comprising:
    providing a contact hole design;
    generating a substantially circular optical proximity correction target of the contact hole design;
    segmenting the substantially circular optical proximity correction target;
    biasing a segment of the substantially circular optical proximity correction target by extending an arc perimeter of the substantially circular optical proximity correction target in a radial direction, while maintaining a dimension of a different segment within the substantially circular optical proximity correction target;
    generating mask data, based on the shape produced by biasing the segment of the substantially circular optical proximity correction target, by using a computer aided design system; and
    making a mask from the mask data.

12. The method as claimed in claim 11 wherein:
    providing the contact hole design includes providing a circular design.

13. The method as claimed in claim 11 wherein:
    generating the substantially circular optical proximity correction target includes generating a substantially circular shape.

14. The method as claimed in claim 11 wherein:
    biasing the segment of the substantially circular optical proximity correction target includes biased forms of the segment located substantially equidistant from the other biased forms of the segment.

15. The method as claimed in claim 11 wherein:
    generating the mask data includes generating a graphic data system out pattern for the mask.

16. The method as claimed in claim 11 wherein:
    biasing the segment of the substantially circular optical proximity correction target is done with reference to nearby features.

17. The method as claimed in claim 16 wherein:
    providing the contact hole design includes providing a circular shaped feature.

18. The method as claimed in claim 16 wherein:
segmenting the substantially circular optical proximity correction target includes segmenting the substantially circular optical proximity correction target into substantially equal partitions.

19. The method as claimed in claim 16 wherein:
biasing a segment of the substantially circular optical proximity correction target includes biasing more than one of the segment.

20. The method as claimed in claim 16 wherein:
generating the mask data based on the shape produced by biasing the segment of the substantially circular optical proximity correction target helps to prevent formation of a side lobe.

* * * * *